Sept. 27, 1955 I. L. AUERBACH ET AL 2,719,228

BINARY COMPUTATION CIRCUIT

Filed Aug. 2, 1951 2 Sheets-Sheet 1

INVENTORS.
Isaac L. Auerbach
BY Stanley B. Disson
Fidler, Crouse & Beardsley Attys.

Sept. 27, 1955 I. L. AUERBACH ET AL 2,719,228

BINARY COMPUTATION CIRCUIT

Filed Aug. 2, 1951 2 Sheets-Sheet 2

INVENTORS.
Isaac L. Auerbach,
BY Stanley B. Disson,
Fidler, Crouse + Beardsley Attys.

United States Patent Office 2,719,228
Patented Sept. 27, 1955

2,719,228

BINARY COMPUTATION CIRCUIT

Isaac L. Auerbach, Philadelphia, Pa., and Stanley B. Disson, Falls Church, Va., assignors to Burroughs Corporation, Detroit, Mich., a corporation of Michigan Application August 2, 1951, Serial No. 239,998
9 Claims. (Cl. 250—27)

This invention relates to improvements in binary commutation or switching circuits of the kind employing electronic discharge devices and such as are employed in, for example, counting and computing apparatus. Copending U. S. patent application Serial No. 244,179, filed on August 29, 1951, by Norman Perlmutter, entitled "Electronic Commutation Circuit" and assigned to the same assignee as the present application, is directed to certain features disclosed but not specifically claimed herein.

An object of the invention is to provide an improved binary electronic commutation circuit operable in response to successive input pulses on a single input terminal.

A further object is to provide an improved binary electronic commutation circuit which may be operated alternately to each of its two stable states responsive to input pulses received alternately on two input terminals and as well by successive input impulses received on a third input terminal.

A further object is to provide a binary commutation device comprising an electronic binary commutation circuit operable to each of two stable states alternately by input pulses received alternately on two separate input conductors in combination with a gating circuit operating upon receiving successive input impulses on a single input conductor to transmit impulses to the respective ones of said two separate input conductors alternately.

A further object is to provide a commutation device which comprises electronic discharge devices and which is reliably operative throughout substantially a greater range of change of characteristics of the electronic discharge devices resulting from aging of the latter, thereby obtaining substantially increased useful life of such electronic discharge devices.

A further object is to provide an improved electronic binary commutator circuit in which the values of circuit elements may be varied through substantial ranges to adapt the circuit to substantially differing operating conditions without adversely affecting reliability of operation.

Among prior commutation devices comprising electronic discharge tubes, it has been found that those employing gaseous tubes are much more reliable but also much slower in operation than those employing vacuum tubes. It is a further object of the invention to provide an improved commutation device having not only the high operating speed obtainable with vacuum tubes but also a reliability much greater than that heretofore obtainable with vacuum tubes.

Other objects and advantages of the invention will become apparent from the following detailed description of a preferred embodiment of the invention illustrated in the accompanying drawings in which.

Figure 1:
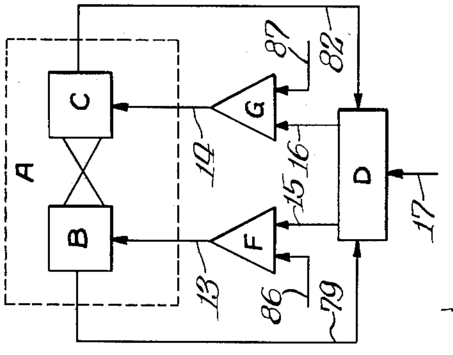
Fig. 1 is a schematic block diagram of the commutation circuit of the present invention.

In general, the commutation device of the present invention, shown schematically in Fig. 1, comprises a bi-stable electronic "flip-flop" circuit represented generally by the block A and including two cross-connected stages B and C comprising, respectively, two alternately conductive vacuum tubes. Gate circuits represented by D have a common input terminal designated 17. The numbers employed as references in Fig. 1 also appear in Fig. 2 and represent, in both figures, the same conductors or terminals. The gate circuits D are also controlled from the bi-stable "flip-flop" A through conductors 79 and 82 so that upon receipt of an input pulse on the terminal 17 an input pulse will be transmitted through the proper one of the gate circuits and to the proper one of the stages B and C to cause an operation of the "flip-flop" A. The gate means D is connected through conductor 15 and device F to the input conductor for tube circuit B, and is similarly connected through conductor 16 and device G to the input conductor 14 for tube circuit C. The device F is a means, composed of the diodes 84 and 88 of Fig. 2, which permits transmission to the input conductor 13 for tube circuit B of input pulses coming either over conductor 15 from gate means D or coming through an input terminal 86. Similarly, device G, composed of diodes 85 and 89 of Fig. 2, permits transmission to the input conductor 14 for tube circuit C of input pulses coming either from gate means D over conductor 16 or through an input terminal 87. Thus, an input pulse may be applied to the input terminal 17 to cause an operation of the "flip-flop" A regardless of which of its stable conditions it happens to be in, or to input terminal 86 to insure that the "flip-flop" A will be in or, if need be, operated to a predetermined one of its stable conditions, or to the input terminal 87 to insure that the "flip-flop" A will be in or, if need be, operated to the other predetermined one of its stable conditions.

Figure 2:
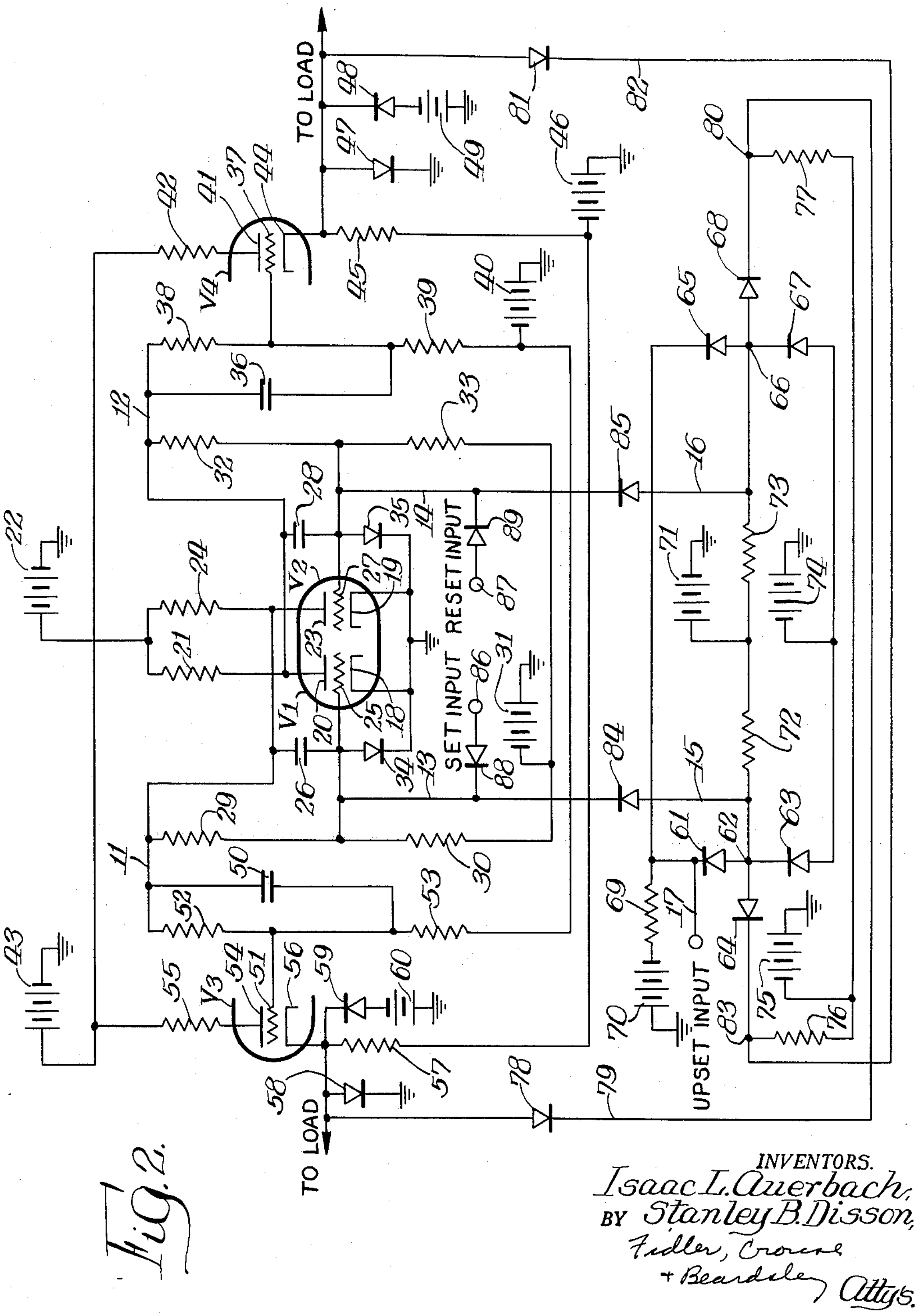
Fig. 2 shows the circuit of a preferred form of the invention.

In the preferred embodiment of the invention shown in Fig. 2, a pair of vacuum triodes V1 and V2 are employed in a commutation or "flip-flop" circuit, the output leads 11 and 12 of which are connected to cathode follower circuits employing a pair of vacuum triodes V3 and V4. The input leads 13 and 14 of the "flip-flop" circuit are connected to the output leads 15 and 16 of gate circuits which are shown in the lower portion of Fig. 2 and which are controlled from the outputs of the cathode follower circuits and have a common input terminal 17. The tubes V1 and V2 are vacuum triodes and may be constituted by a single envelope twin tube such as the 12AV7 tube produced by the Landsdale Tube Company. Other vacuum, gas or glow discharge tubes or similar devices may be employed in the circuit of Fig. 2 in place of the 12AV7 tubes with appropriate changes in the values of the various circuit components to suit the specific characteristics of the substituted tubes. Tubes having rather large anode current at zero grid bias and having relatively sharp cut-off are advantageous. The tubes V3 and V4 are also vacuum triodes and may be constituted by a 5687 twin tube produced by Tung-Sol Lamp Works, Inc. When the above-mentioned 12AV7 and 5687 tubes are employed, the values of the components of the circuit of Fig. 2 are preferably the following:

*Batteries*

| Ref. No.: | Volts |
|---|---|
| 22 | 250 |
| 31 | 150 |
| 40 | 200 |
| 43 | 105 |
| 46 | 105 |
| 49 | 25 |
| 60 | 25 |
| 70 | 105 |
| 71 | 105 |
| 74 | 15 |
| 75 | 105 |

*Condensers*

| Ref. No.: | MMF |
|---|---|
| 26 | 10 |
| 28 | 10 |
| 36 | 39 |
| 50 | 39 |

*Resistors*

| Ref. No.: | Ohms |
|---|---|
| 21 | 21,500 |
| 24 | 21,500 |
| 29 | 100,000 |
| 30 | 110,000 |
| 32 | 100,000 |
| 33 | 110,000 |
| 38 | 300,000 |
| 39 | 360,000 |
| 42 | 470 |
| 45 | 30,000 |
| 52 | 300,000 |
| 53 | 360,000 |
| 55 | 470 |
| 57 | 30,000 |
| 69 | 11,000 |
| 72 | 39,000 |
| 73 | 39,000 |
| 76 | 22,000 |
| 77 | 22,000 |

The cathode 18 of tube V1 and the cathode 19 of tube V2 are both connected to ground. The anode 20 of tube V1 is connected through a resistor 21 to the positive terminal of a battery 22. The anode 23 of tube V2 is similarly connected through a resistor 24 to the positive terminal of the battery 22, the negative terminal of which is grounded. The control grid 25 of the tube V1 is connected to one terminal of a condenser 26 having its other terminal connected to the anode 23 of the tube V2. Similarly the control grid 27 of the tube V2 is connected to one terminal of a condenser 28 having its other terminal connected to the anode 20 of the tube V1. The grid 25 of the tube V1 is also connected to the junction between voltage divider resistors 29 and 30 which are connected, respectively, to the anode 23 of the tube V2 and the negative terminal of a battery 31, the positive terminal of which is grounded. Similarly, the grid 27 of the tube V2 is connected to the junction between voltage divider resistors 32 and 33 which are connected, respectively, to the anode 20 of the tube V1 and the negative pole of the battery 31. A diode 34 is connected between the grid 25 and the cathode 18 of the tube V1 and a diode 35 is connected between the grid 27 and the cathode 19 of the tube V2 to prevent the potentials of the grids 25 and 27 from rising above the potentials of the cathodes 18 and 19, i. e., ground potential. The diodes 34 and 35, as well as the other diodes shown in Fig. 2 and referred to hereinafter, may be germanium crystal diodes or other suitable asymmetrically conductive devices known in the art.

The above described portion of the circuit of Fig. 2 constitutes a "flip-flop" circuit wherein the tubes V1 and V2 are alternately conducting and non-conducting, each of said tubes being extinguished when the other becomes conducting. If, when the tube V1 is non-conducting and the tube V2 is conducting, an input pulse is applied to the input conductor 13, the potential of the grid 25 of tube V1 is raised above the negative potential at which it is normally maintained by batteries 22 and 31 and resistors 24, 29 and 30 while the tube V2 is conducting and the tube V1 non-conducting. That increases the flow of current from the battery 22 through the anode 20 and resistor 21, thereby lowering the potential of the anode 20 and causing a negative-going potential front to be applied through condenser 28 to the grid 27 of the tube V2. This causes a reduction of the current flowing from battery 22 through the resistor 24 and anode 23, whereby the potential of the anode 23 rises and, through condenser 26, applies a positive potential pulse to the grid 25. By these actions, the tube V1 becomes conducting and the tube V2 becomes non-conducting. By a similar action a subsequent input impulse applied to the input conductor 14 will cause the tube V2 to again become conducting and the tube V1 to again become non-conducting.

It will be understood that outputs from the "flip-flop" circuit may be taken through the conductors 11 and 12 directly from the anodes 23 and 20. It is, however, preferred to provide outputs of a greater magnitude by means of cathode follower circuits employing an additional pair of tubes V3 and V4. The conductor 12, connected to the anode 20 of the tube V1, is connected to one terminal of a condenser 36, the other terminal of which is connected to the grid 37 of tube V4. The grid 37 is also connected to the junction between voltage divider resistors 38 and 39 which are connected in series between the conductor 12 and the negative terminal of a battery 40, the positive terminal of which is grounded. The anode 41 of the tube V4 is connected through a resistor 42 to the positive terminal of a battery 43 having its negative terminal grounded. The cathode 44 of the tube V4 is connected through a resistor 45 to the negative terminal of a battery 46 having its positive terminal connected to ground. The potentials of the batteries 43 and 46 and the values of the resistances 42 and 45 are so proportioned that, when the tube V4 is conducting, they would raise the potential of the cathode 44 above ground potential were it not that a diode 47 is connected between the cathode 44 and ground so as to prevent the potential of said cathode 44 from rising above ground potential. When the tube V4 is in its substantially non-conducting state, the current through that tube is at such a low value that it alone can produce only a small potential drop across the resistance 45 so that the potential of the cathode 44 would, therefore, tend to drop to a value only a little above that of the negative terminal of the battery 46. However, a diode 48 is connected between the cathode 44 and the negative terminal of a battery 49, having its positive terminal grounded, so as to prevent the potential of the cathode 44 from being depressed substantially below the potential of the negative terminal of the battery 49. The voltage of the battery 49 is less than the voltage of the battery 46 by an amount which substantially exceeds that portion of the voltage drop across the resistor 45 which is due to the current passing through the tube V4 when that tube is in its substantially non-conducting state.

The conductor 11 connects the anode of the tube V2 to a corresponding cathode follower circuit designated by the reference numbers 50 and 59 and including the tube V3 and the batteries 40, 43 and 46.

When the tube V1 is non-conducting and tube V2 is conducting, tube V3 is non-conducting and tube V4 is conducting. Conversely, when the tube V1 is conducting and tube V2 is non-conducting tube V3 is conducting and tube V4 non-conducting. When the tube V1 is non-conducting and the anode 20 thereof is at its high potential, the grid 37 of the tube V4 is held at its high potential, the anode current of the tube V4 is at its maximum and the cathode 44 of the tube V4 is at approximately ground potential. Tube V2 being in its conducting state, its anode 23 is at its low potential so that the grid 51 of the tube V3 will be at its low potential, the anode current of the tube V3 will be at its minimum, and the cathode 56 of tube V3 will be at approximately the potential of the negative terminal of the battery 60. When the tube V1 passes from its non-conducting state to its conducting state and tube V2 passes from its conducting state to its non-conducting state as previously described, the potential of the anode 20 of tube V1 and thus also the potential of the grid 37 of the tube V4 drop to their minimum values, the anode current of the tube V4 is reduced to its minimum value and the potential of the cathode 44 of tube V4 is pulled down by the battery 46 to a value just a little less than that of the negative terminal of the battery 49. As the potential of the anode 23 of the tube V2 rises to its maximum when the latter becomes non-conducting, the potential of the grid 51 of the tube V3 is also raised to its maximum value, causing the anode current of tube V3 to rise to its high value and the potential of the cathode 56 to rise to approximately ground potential.

Gate circuits having the common input terminal 17 are controlled from the cathodes 44 and 56 of the tubes V3 and V4 so that as sucessive input pulses are received on the input terminal 17, pulses are applied alternately to the input conductors 13 and 14 of the previously described "flip-flop" circuit to cause successive reversals of the conducting and non-conducting states of the tubes V1 and V2 and of the tubes V3 and V4.

The input terminal 17 is connected to the cathode of a diode 61, the anode of which is connected to a junction 62 to which the cathode of a diode 63 and the anode of a diode 64 are also connected. The terminal 17 is also connected to the cathode of a diode 65, the anode of which is connected to a junction 66 to which the cathode of a diode 67 and the anode of a diode 68 are also connected. The terminal 17, and thus also the cathodes of diodes 61 and 65, are also connected through a resistor 69 to the negative terminal of a battery 70 which has its positive terminal grounded. A battery 71 has its negative terminal grounded and its positive treminal connected through a resistor 72 to the junction 62 and through a resistor 73 to the junction 66. A battery 74 has its positive terminal grounded and its negative terminal connected to the anodes of diodes 63 and 67. A battery 75 has its positive terminal grounded and its negative terminal connected through resistor 76 to the cathode of diode 64 and through resistor 77 to the cathode of diode 68.

The cathode 56 of tube V3 is connected through a diode 78 and conductor 79 to the junction 80 between the resistor 77 and the cathode of diode 68, and the cathode 44 of tube V4 is connected through a diode 81 and conductor 82 to the junction 83 between the resistor 76 and the cathode of diode 64. The junctions 62 and 66 are connected through diode 84 and 85, respectively, to the input conductors 13 and 14, respectively, of the "flip-flop" circuit.

The voltages of batteries 70, 71, 74 and 75 and the resistances 69, 72 and 76 are so proportioned that current from the battery 71, through resistor 72, dividing through resistors 69 and 76 and batteries 70 and 75 to ground, tends to drive the potential of junction 62 substantially below the potential of the negative terminal of the battery 74, though the diode 63 prevents the potential of junction 62 from going substantially below the potential of the negative terminal of the battery 74. Diodes 84 and 34 prevent the potential of junction 62 from rising substantially above ground or "0" potential. The range of potential variation on terminal 66 is similarly restricted. The current flow through resistor 69 and battery 70 tends also to keep the potential of the input terminal 17 at its low value which, also because of diodes 61, 63, 65 and 67, is prevented from dropping substantially below the potential of the negative terminal of the battery 74.

Operation of the circuit of Fig. 2 is illustrated in principle in Figs. 3A to 3F, which show the timing and the nature of the changes of potential at the indicated points in the circuit as hereinafter explained. The several curves are identified by the same reference numbers which designate the elements or points on or at which the represented potentials occur. The abscissae of Figs. 3A to 3F have a common scale of time but the scales of the ordinates of the several figures, representing potentials, are not the same for all figures. It will be readily understood that the actual potentials obtained at the various points in the circuit will depend upon the characteristics of the particular tubes employed and on the specific values chosen for the various circuit components to suit the characteristics of the employed tubes. In any case, however, the events and their timing, approximately, will be as indicated in Figs. 3A to 3F. The divisions along the time axis are of the order of one-tenth of a micro-second. The operations resulting from two successive pulses arriving more than one micro-second apart are shown. Ground or "0" potentials are shown on, higher or positive potentials above, and lower or negative potentials below the time axis of each figure. The arrival of the beginning of the first voltage pulse at the input terminal 17 is taken as 0 time and the arrival of the beginning of the second pulse is taken as 0′ time.

Figures 3A, 3B, 3C, 3D, 3E, 3F:
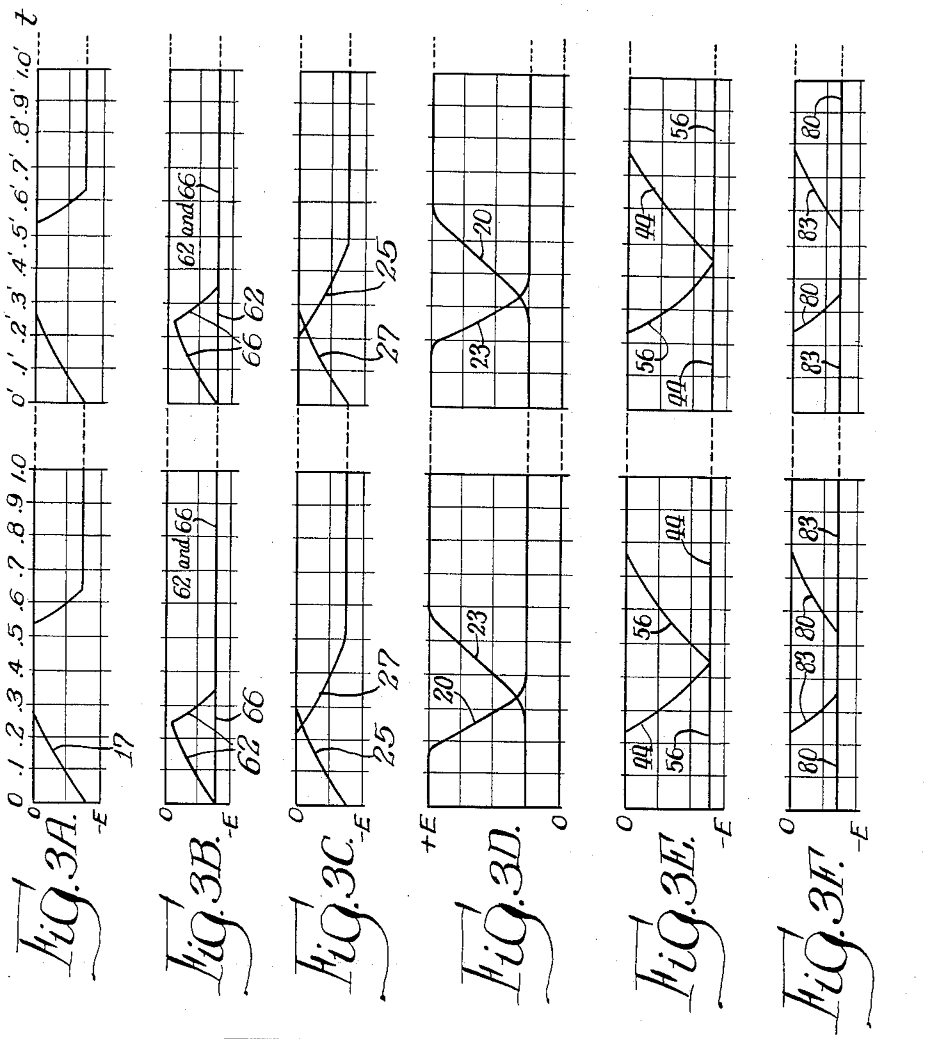
Figs. 3A to 3F are curves representing the changing potentials at certain points in the circuit of Fig. 2 during successive cycles of operation of that circuit.

It is assumed that, initially the tube V1 (Fig. 2) is non-conducting and the tube V2 is conducting. The potential of the anode 20 of the tube V1 is at its high value (Fig. 3D), wherefore the potential of the grid 37 of the tube V4 is at its high value, the anode current of the latter tube is at its high value and the potential of the cathode 44 is at its high value of approximately 0 (Fig. 3E). Because of conduction through the diode 81, junction 83 is also at approximately 0 or ground potential (Fig. 3F). The potential of the anode 23 of tube V2 is at low value (Fig. 3D) so that the potential of the grid 51 of tube V3 is at its low value, the anode current of the latter tube is at its low value, and the potential of the cathode 56 is at its low value (Fig. 3E). The potentials of junctions 62 and 66 (Fig. 3B) are approximately the same as the potential of the negative terminal of the battery 74 which is substantially below the high potential (Fig. 3E) on cathode 44 of tube V4 and substantially above the low potential on cathode 56 of tube V3. The battery 75 holds the potential of junction 80 (Fig. 3F) down to the potential of the junction 66 (Fig. 3B), but, because of the diode 68, cannot depress the potential of the junction 80 below the potential of the junction 66.

At 0 time the potential on the input conductor 17 (Fig. 3A) starts to rise because of an input pulse being delivered thereto. It is assumed that the input pulse is of such character as to increase the potential of the input terminal 17 to 0 potential at about time .27 and maintain it at that value until about time .55. While the junction 83 is at ground potential and the junction 62 at a lower potential, diode 64 is substantially non-conducting and as the potential of the input terminal 17 rises, the battery 71 will raise the potential of junction 62 (Fig. 3B) which, through diode 84, is effective to raise the potential of grid 25 of tube V1 (Fig. 3C).

The rising potential of the input terminal 17 will not cause the potential of junction 66 to rise because, while cathode 56 of tube V3 is at its low potential, the battery 75 holds the potential of the junction 80 (Fig. 3F) and, through diode 68, also the potential of the junction 66 (Fig. 3B) down to the potential of the negative terminal of the battery 74.

As the potential of the grid 25 of tube V1 rises (Fig. 3C), the anode current of that tube increases, the potential of the anode 20 (Fig. 3D) falls and the potential of grid 37 of tube V4 falls. This causes the anode current of tube V4 to decrease so that the potential of cathode 44 drops (Fig. 3E) and, as conduction through the diode 81 substantially ceases, battery 75 causes the potential of junction 83 (Fig. 3F) to follow the potential of the cathode 44 downward. After the falling potential of the junction 83 and the rising potential of junction 62 have reached equality at about time .25, conduction through diode 64 causes the potential of the junction 62 (Fig. 3B) to follow the potential of the junction 83 (Fig. 3F) downward until equality with the potential of the negative terminal of the battery 74 is reached, at about time .33, after which the battery 74, through diode 63, prevents the potential of the junction 62 from going substantially lower.

Meanwhile, the falling potential of the anode 20 (Fig. 3D) of tube V1 has caused a reduction of the potential of the grid 27 of tube V2, whereby the anode current of the latter tube has been reduced and the potential of the anode 23 has increased, thereby increasing the potential of the grid 51 of tube V3, increasing the anode current thereof and raising the potential of the cathode 56 and the potential of the junction 80 to approximately 0 or ground potential prior to time .80.

If the high potential of the input pulse were maintained on the terminal 17 after the potential of the cathode 56 and of the junction 80 have risen considerably above the normal low potential of the junction 66, the potential of the latter might be increased sufficiently to transmit a small pulse through the diode 85 to the grid 27. The input pulse to the terminal 17 should, therefore, be short enough to permit the potential on the input terminal 17 to return to nearly its normal low value before the potentials of the cathode 56 and junction 80 have risen far above the normal low potential of the junction 66.

From the foregoing it will have been noted that, because of the times required for the discharging and charging of condensers 28 and 26, the potential of the anode 20 of tube VI attains its low value (Fig. 3D) a short time after the potential of the grid 25 reaches its maximum (Fig. 3C), the potential of the anode 23 of tube V2 reaches its high value a short time after the potential on the grid 27 reaches its low value, and the tube V2 attains its stable non-conducting condition a short time after the tube V1 attains its stable conducting condition. It will also have been noted that because of the condenser 36 connected across the resistor 38 connected between the anode 20 of the tube VI and the grid 37 of the tube V4, the conductance of the latter tube and the potential of its cathode 44 reach their low values a short time after the anode 20 of the tube V1 attains its low value, and that because of the condenser 50, the conductance of the tube V4 and the potential of its cathode 56 reach their high values a short while after the anode 23 of the tube V2 reaches its high value. These time lags are all in the neighborhood of one-tenth of a micro-second and the cycle of operation of the circuit of Fig. 2 is completed within about 0.8 micro-second from the beginning of the receipt of an input pulse on the input terminal 17.

As the potential of the junction 80 has been raised to its high value above the normal potential of the junction 66, and as the potential of the junction 83 has been reduced to a low value which is substantially the normal potential of the junction 62, the conditions of the gate circuits have been altered so that when, at a later time 0′, another input pulse is received on the terminal 17, the potential of the junction 66 will be raised to transmit an impulse through the diode 85 to the grid 27 of the tube V2, but the potential of the junction 62 will be held steady at its normal low value. The circuit will then run through a further cycle of operation as depicted in the right-hand portions of Figs. 3A to 3F and as will be readily understood from the preceding description of the cycle of operation initiated by the input pulse starting at time 0. At the end of such second cycle of operation, the circuit will again be in the same condition as it was at time 0.

Setting and resetting input terminals 86 and 87 are connected through diodes 88 and 89, respectively, to the input conductors 13 and 14, respectively, of the "flip-flop" circuit so that a positive potential pulse upon the setting terminal 86 and through the diode 88 will cause a cycle of operation only if that is necessary to render the tube V1 conducting and the tube V2 non-conducting, whereas a positive potential pulse on the resetting terminal 87 and through the diode 89 will cause a cycle of operation of the circuit only if that is necessary to render the tube V2 conducting and the tube V1 non-conducting. Thus, the circuit of Fig. 2 will not only perform successive cycles of operation responsive to successive input pulses on a single input terminal 17 but may also be controlled through separate input terminals 86 and 87 to insure that the circuit will be in or operated to either desired one of its two stable conditions. This flexibility and versatility has been obtained by combining the gating circuits of the lower portion of Fig. 2 with the "flip-flop" circuit of the central upper portion of Fig. 2. The diodes 84 and 85 isolate the grids 25 and 27 from the points 62 and 66 when the respective tubes V1 and V2, alternately, are conducting and, additionally, prevent the conditions of the gate circuits from being altered directly by input pulses on the terminals 86 and 87.

The cathode follower circuits of the right and left sides of the upper portion of Fig. 2 provide advantageously strong outputs and insure highly reliable control of the gating circuits. These cathode follower circuits also delay application of the control potentials to the gate circuits sufficiently after the operation of the "flip-flop" circuit of the tubes V1 and V2 to insure clearance of an input pulse from the terminal 17 and prevent a double cycle of operation being caused by a single input pulse on terminal 17. The circuit of the present invention is capable of utilizing input pulses which, considering the high operating frequency, of the order of several hundred thousand operations per second, have relatively slow rates of potential rise and are of relatively long duration.

It will be noted that the swing of potential on the anodes 20 and 23 of the "flip-flop" tubes V1 and V2 as these tubes change from non-conducting condition to conducting condition and reversely is greater than required for the control of the cathode follower tubes V3 and V4 and that the swing of potential of the cathodes 44 and 56 of the latter tubes is greater than that utilized or required to control the gating circuits. Consequently, substantial changes may be made in the values of various components of the circuit to substantially differing operating conditions, and very substantial changes of the characteristics of the tubes V1, V2, V3 and V4 resulting from age may occur without affecting the reliability or significantly affecting the speed of operation of the circuit as a whole. For example, the circuit of Fig. 2 will still operate reliably when the emissivity of the cathodes of the tubes has decreased to one-fourth of the original value. The circuit of Fig. 2 thus has the advantageous speed of operation, resulting from the use of tubes of the "hard" or "vacuum" type, as well as great reliability and accuracy with substantially increased useful tube life.

The practical value of the advantageous new characteristics of the present invention in various uses thereof will be readily appreciated. The new binary commutation circuit is especially well adapted for use in the construction of binary counters in which a number of such circuits may be arranged in a series in which one of the outputs of each, i. e., cathode 44, is suitably connected to the upset input 17 of the succeeding one in the series, the set inputs 86 may be utilized for "charging" the counter with any desired starting number or value, and the reset inputs 87, connected to a common conductor, may be utilized for resetting or zeroizing the counter when desired.

It will be apparent that various details of the specific embodiment of the invention herein illustrated and described by way of example may be modified in various ways within the scope of the invention as defined in the appended claims.

We claim:

1. A commutator circuit comprising an impulse responsive bi-stable circuit including first and second electron discharge tubes and first and second impulse input leads associated with respective ones of said tubes, first and second gate circuit means having a common impulse input terminal, separate impulse output leads and separate control input leads, connections from each of said output leads to a respective one of said first and second impulse input leads, and circuit means coupling each of said separate control input leads with a respective one of said tubes to condition said gate circuit means, in accordance with the conditions of the respective tubes, to apply to said first and second impulse input leads, alternately successive input impulses appearing on said common input terminal.

2. A commutator circuit comprising an impulse responsive bi-stable circuit including first and second electron discharge tubes and first and second impulse input leads associated with respective ones of said tubes, first and second gate circuit means having a common impulse input terminal, separate impulse output leads and separate control input leads, connections from each of said output leads to a respective one of said first and second input leads, and circuit means including potential limiting means and coupling each of said gate circuit control input leads with a respective one of said tubes.

3. A commutator circuit comprising an impulse responsive bi-stable circuit including first and second electron devices and first and second impulse input leads associated with respective ones of said electron devices, first and second gate circuit means having a common impulse input terminal, separate impulse output leads and separate control input leads, a pair of asymmetrically conducting devices, connections from each of said output leads to a respective one of said asymmetrically conducting devices and from each of the latter to a respective one of said first and second input leads, circuit means coupling each of said gate circuit control input leads with a respective one of said electron devices, a second pair of asymmetrically conducting devices, each connected to a respective one of said first and second input leads, and separate input terminals connected, respectively, to each one of the last mentioned asymmetrically conducting devices.

4. A commutator circuit comprising an impulse responsive bi-stable circuit including first and second electron discharge tubes, first and second impulse input leads associated with respective ones of said tubes and first and second control potential output leads associated with respective ones of said tubes, first and second cathode follower circuits each including an electron discharge tube, a control potential input lead connected with a respective one of the control potential output leads of said bi-stable circuit, and a control potential output lead, first and second gate circuit means having a common impulse input terminal, separate impulse output leads and separate control potential input leads, circuit means connecting said impulse output leads with respective ones of said first and second impulse input leads of said bi-stable circuit, and circuit means connecting each of said cathode follower circuit control potential output leads with a respective one of said gate circuit control potential input leads to cause said gate circuits, upon application of successive impulses on said common input terminal, to apply alternate impulses to alternate ones, respectively, of said impulse input leads of said bi-stable circuit.

5. A commutator circuit comprising an impulse responsive bi-stable circuit including first and second electron discharge devices, first and second impulse input leads associated with respective ones of said discharge devices and first and second control potential output leads associated with respective ones of said discharge devices, first and second cathode follower circuits each including an electron discharge device, a control potential input lead connected with a respective one of the control potential output leads of said bi-stable circuit, a control potential output lead, a minimum potential source, an asymmetrically conducting device having an anode connected to said minimum potential source and a cathode connected to said control potential output lead of said cathode follower circuit to establish a minimum limit on the potential of said lead, first and second gate circuit means having a common impulse input terminal, separate impulse output leads and separate control potential input leads, circuit means connecting said impulse output leads with respective ones of said first and second impulse input leads of said bi-stable circuit, and circuit means connecting each of said cathode follower circuit control potential output leads with a respective one of said gate circuit control potential input leads to cause said gate circuits, upon application of successive impulses on said common input terminal, to apply alternate impulses to alternate ones, respectively, of said impulse input leads of said bi-stable circuit.

6. A commutator circuit comprising an impulse responsive bi-stable circuit including first and second electron discharge devices, first and second impulse input leads associated with respective ones of said discharge devices and first and second control potential output leads associated with respective ones of said discharge devices, a pair of asymmetrically conducting devices each connected to a respective one of said input leads, a pair of input terminals each connected to a respective one of said asymmetrically conducting devices, first and second cathode follower circuits each including an electron discharge device, a control potential input lead connected with a respective one of the control potential output leads of said bi-stable circuit, a control potential output lead, a minimum potential source, an asymmetrically conducting device having an anode connected to said minimum potential source and a cathode connected to said control potential output lead of said cathode follower circuit to establish a minimum limit on the potential of said lead, first and second gate circuit means having a common impulse input terminal, separate impulse output leads and separate control potential input leads, a second pair of asymmetrically conducting devices each connected between a respective one of said impulse output leads and a respective one of said first and second impulse input leads of said bi-stable circuit, and circuit means connecting each of said cathode follower circuit control potential output leads with a respective one of said gate circuit control potential input leads to cause said gate circuits, upon application of successive impulses on said common input terminal, to apply alternate impulses to alternate ones, respectively, of said impulse input leads of said bi-stable circuit.

7. A commutator circuit comprising a bi-stable circuit means, said bi-stable circuit means comprising first and second electron devices, first and second gate circuit means, first and second circuit means associating said first and second gate circuit means respectively with said first and second electron devices, input means common to said first and second gate circuit means, and a third and fourth circuit means associating said electron devices with said gate circuits respectively to cause a series of pulses to be conducted alternately through said gate circuits when a series of input pulses is impressed upon said input means.

8. A commutator circuit comprising a bi-stable circuit means including first and second electron discharge tubes, first and second cathode follower circuits, first and second circuit means associating said first and second electron discharge tubes with said first and second cathode follower circuits to vary the outputs of said cathode follower circuits in accordance with variations of the outputs of said electron discharge tubes, respectively, gate circuit means having a single input and two outputs, third and fourth circuit means associating said cathode follower circuits, respectively, with said gate circuit means to vary the responsiveness of said gate circuit outputs to pulses applied to said input in accordance with variations of the outputs of said cathode follower circuits, and fifth and sixth circuit means coupling the outputs of said gate circuits to said first and second electron discharge tubes, respectively.

9. A commutator circuit comprising a bi-stable circuit means including first and second electron discharge tubes each having an anode and a control grid, first and second cathode follower circuits, first and second circuit means coupling said first and second cathode follower circuits with said anodes of said first and second electron discharge tubes, respectively, to vary the outputs of said cathode follower circuits in accordance with variations of the potentials of said anodes, respectively, gate circuit means having a single input and two outputs, third and fourth circuit means coupling said cathode follower circuits, respectively, with said gate circuit means to vary the responsiveness of said gate circuit outputs to pulses applied to said input in accordance with variations of the outputs of said cathode follower circuits, and fifth and sixth circuit means coupling the outputs of said gate circuits to control grids of said first and second electron discharge tubes, respectively.

References Cited in the file of this patent

UNITED STATES PATENTS

| | | |
|---|---|---|
| 2,540,442 | Grosdoff | Feb. 6, 1951 |
| 2,575,087 | Baker | Nov. 13, 1951 |